US009536420B2

(12) United States Patent
San Andres et al.

(10) Patent No.: US 9,536,420 B2
(45) Date of Patent: Jan. 3, 2017

(54) APPARATUS AND METHOD OF PERFORMING CUSTOMER-DESIGNATED ACTION BASED ON POWER EVENT

(75) Inventors: Ramon Juan San Andres, Duluth, GA (US); Marc Karl Losée, Woodstock, GA (US); Atul Nigam, Suwanee, GA (US)

(73) Assignee: General Electric Company, Schenectady, NY (US)

( * ) Notice: Subject to any disclaimer, the term of this patent is extended or adjusted under 35 U.S.C. 154(b) by 1077 days.

(21) Appl. No.: 13/293,746

(22) Filed: Nov. 10, 2011

(65) Prior Publication Data

US 2013/0120151 A1    May 16, 2013

(51) Int. Cl.
| | |
|---|---|
| *G08B 21/00* | (2006.01) |
| *G08B 27/00* | (2006.01) |
| *G01R 19/25* | (2006.01) |
| *G08B 21/18* | (2006.01) |
| *G01R 31/08* | (2006.01) |

(52) U.S. Cl.
CPC ......... *G08B 27/006* (2013.01); *G01R 19/2513* (2013.01); *G01R 31/08* (2013.01); *G08B 21/185* (2013.01)

(58) Field of Classification Search
CPC .............. G06F 1/26; G06F 1/30; G06Q 50/00; G06Q 50/06; Y04S 10/00; Y04S 10/10; Y04S 10/26; Y04S 10/30; Y04S 10/40; Y04S 10/50; Y04S 10/52; Y04S 10/522; Y04S 10/525; Y04S 10/527; Y04S 20/00
USPC ...... 702/58, 59, 185; 340/635, 12.32, 693.1, 340/288, 3.43
See application file for complete search history.

(56) References Cited

U.S. PATENT DOCUMENTS

| | | | | |
|---|---|---|---|---|
| 6,963,285 | B2 * | 11/2005 | Fischer et al. | ................ 340/635 |
| 8,000,913 | B2 * | 8/2011 | Kreiss et al. | .................. 702/60 |
| 2011/0116387 | A1 * | 5/2011 | Beeco et al. | ................. 370/242 |
| 2012/0109545 | A1 * | 5/2012 | Meynardi et al. | .............. 702/58 |
| 2013/0063272 | A1 * | 3/2013 | Bhageria et al. | ............ 340/650 |

* cited by examiner

*Primary Examiner* — Ryan Sherwin
(74) *Attorney, Agent, or Firm* — Sutherland Asbill & Brennan LLP (57) ABSTRACT

A power grid event detection apparatus includes an event detection unit to detect a location of an event in a power grid, a customer location unit to determine a location of interest to an interested party, and a rule application unit to determine whether to perform an action designated by the interested party at least when the location of the event corresponds to the location of interest to the interested party.

20 Claims, 8 Drawing Sheets

| Event | Type | Cause | Location | Time to Repair | Last Update | Update Source |
|---|---|---|---|---|---|---|
| 25 | Unscheduled outage | Unknown | P33, P34 | 8 hours | 15 min ago | Substation 99 |
| 24 | Unscheduled outage | Tree limb | B30, C30 | 3 hours | 20 min ago | Work Crew Onsite |
| 23 | Scheduled outage | Predicted Power Usage | E1-E5, D1-D5 | 1 hour | 3 days ago | The Power Utility Co. |
| | | | | | | |

| Customer Name: | Customer A |
| Customer Type: | Emergency Service |
| Address: | 77 DEF Dr. (Region: O.O.A.) |

Rule 1

| | Location - of - interest: | |
| | Select on map: | ☒ Select All |
| AND | Event - of - interest: | |
| | All Power Outages | ☐ Select All |
| AND | Time/Day/Data of Event | |
| | Select | ☒ Select All |
| AND | Estimated time for repair | |
| | Select | ☒ Select All |

ACTION

| Text | to: | ### ... |
| | AND | |
| Email | to: | abc@ ... |

Geographic Location Monitoring Function

Disabled

APPARATUS AND METHOD OF PERFORMING CUSTOMER-DESIGNATED ACTION BASED ON POWER EVENT

BACKGROUND OF THE INVENTION

The subject matter disclosed herein relates to detecting and responding to power events such as power outages. In particular, power grids are subject to scheduled and unscheduled outages and other events. However, customers have difficulty obtaining information about outages when they occur, and may not know about scheduled outages or maintenance that affects the customers.

BRIEF DESCRIPTION OF THE INVENTION

According to one aspect of the invention, a power event detection apparatus comprises an event detection unit to detect at least a location of an event in a power grid; a customer location unit to determine a location of interest to an interested party; and a rule application unit to determine whether to perform an action designated by the interested party at least when the location of the event corresponds to the location of interest to the interested party.

According to another aspect of the invention, a power event detection system comprises a power grid to supply power to a customer; an event detection apparatus to detect at least a location of an event in the power grid, to compare the location of the event to a location of interest to an interested party, and to perform an action designated by the interested party when the location of the event corresponds to the location of interest to the interested party; and a remote device of the interested party to receive from the event detection apparatus at least one of an alert and a command corresponding to the action designated by the interested party.

According to yet another aspect of the invention, a method of responding to a power event includes obtaining location information of an event in a power grid; obtaining location-of-interest information corresponding to an interested party; comparing the location information of the power event with the location-of-interest information; and performing an action designated by the interested party when the location information of the power event corresponds to the location-of-interest information.

These and other advantages and features will become more apparent from the following description taken in conjunction with the drawings.

BRIEF DESCRIPTION OF THE DRAWINGS

The subject matter, which is regarded as the invention, is particularly pointed out and distinctly claimed in the claims at the conclusion of the specification. The foregoing and other features are apparent from the following detailed description taken in conjunction with the accompanying drawings in which:

The detailed description explains embodiments of the invention, together with advantages and features, by way of example with reference to the drawings.

DETAILED DESCRIPTION OF THE INVENTION

Figure 1:
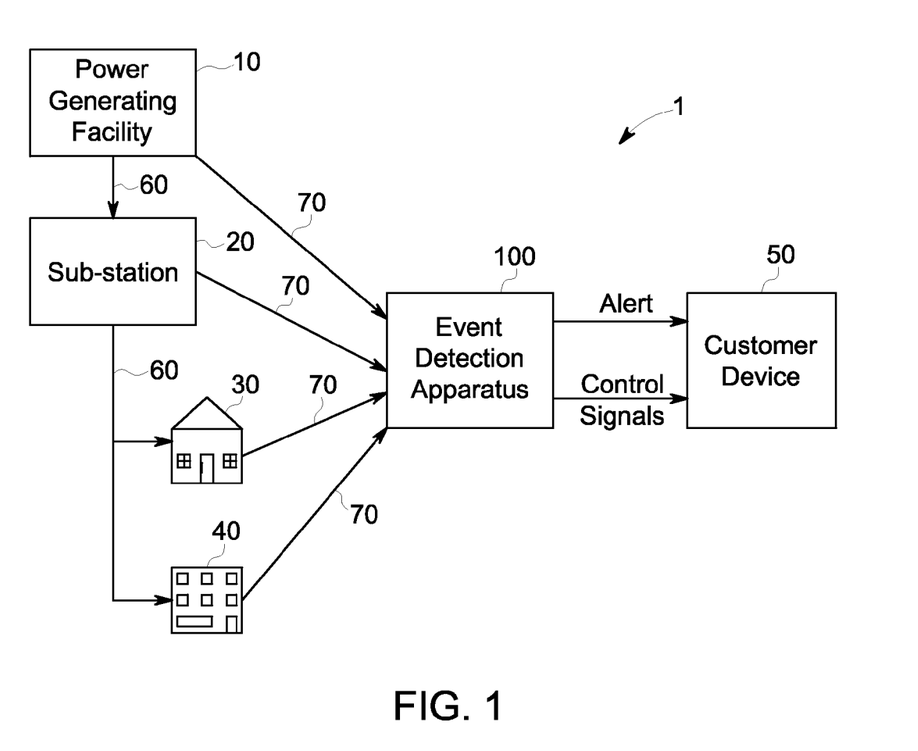
FIG. 1 is a diagram to illustrate a power grid notification system.

FIG. 1 illustrates a power grid event notification system 1 according to one aspect of the invention. The power grid includes a power generating facility 10, such as a coal, nuclear, or solar plant that transmits electricity via transmission wires 60 to a power sub-station 20. The power sub-station 20 transmits the power via transmission wires 60 to end-users, including homes 30 and businesses 40. Each of the power generating facility 10, the power sub-station 20, and the end users, including the homes 30 and businesses 40, transmits data to an event detection apparatus 100 via data lines 70. According to one embodiment, the event detection apparatus 100 receives the event information from a Distribution Management System (DMS) operated by the power provider. The DMS receives the event information from the end users, such as the homes 30 and businesses 40. According to an alternative embodiment, the event detection apparatus 100 is part of the DMS and receives the event information directly from the end users, including the homes 30 and businesses 40. According to one embodiment, the data lines 70 are wireless data streams.

The event detection apparatus 100 receives the data from the data lines 70, determines whether a power event has occurred in the power grid, and determines whether to transmit alerts or control signals based on rules set up by customers. The alerts and control signals are set to customer devices 50 controlled or operated by a customer, such as communication devices.

Figure 2:
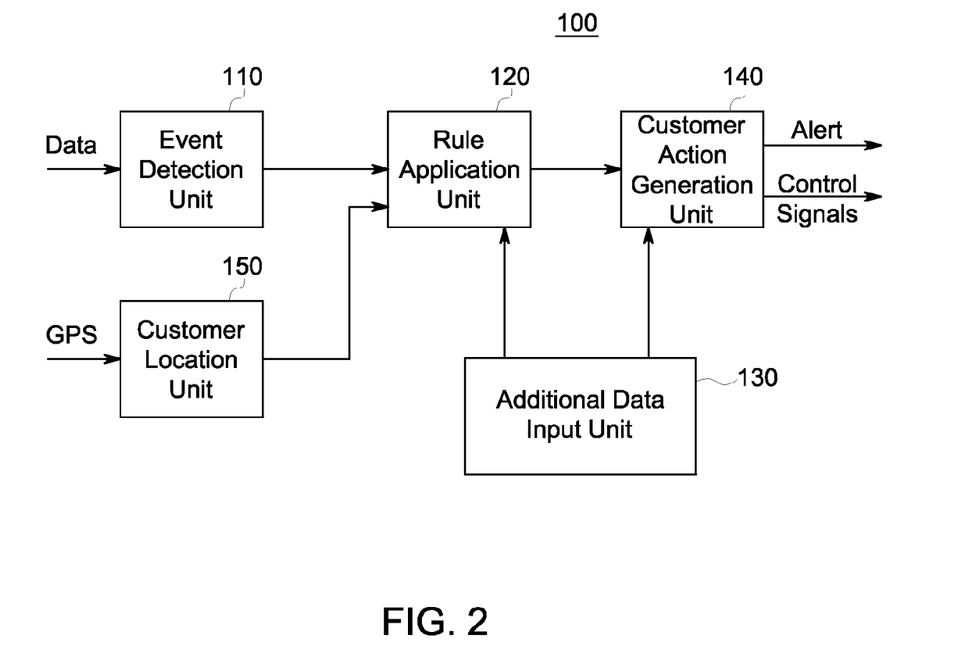
FIG. 2 is a block diagram to illustrate a power grid event detection apparatus.

FIG. 2 illustrates a block diagram of the event detection apparatus 100. The event detection apparatus 100 includes an event detection unit 110 that receives the data from the data lines 70. When an event is detected, the data about the event, such as type of event, time of occurrence, and location, are transmitted to a rule application unit 120. Detected events include unscheduled events, such as power outages caused by electrical or mechanical failures in the grid, accidents that affect the grid, weather, and other extreme conditions. Detected events also include scheduled events, such as rolling blackouts, scheduled grid maintenance, and tree trimming, and data regarding the scheduled events is provided to the event detection unit 110 in advance of the scheduled event.

The event detection apparatus 100 further includes a customer location unit 150 to store customer location data. The customer location unit 150 stores pre-set customer location data, such as a customer address and locations-of-interest to the customer, as well as GPS data received from a device designated by the customer to provide real-time location information to the customer location unit 150.

The rule application unit 120 includes rules set up by customers, by the power provider, and by other interested parties to determine actions to be taken based on the detected event. The rule application unit 120 compares the location information regarding the event from the event detection unit 110 with the location information corresponding to customers from the customer location unit 150. When the locations correspond to each other, the rule application unit 120 applies rules set up by the customer and by the power provider to determine an action to be taken.

The event detection apparatus 100 further includes an additional data input unit 130 and a customer action generation unit 140. The customer action generation unit 140 receives a command from the rule application unit 120 to generate or initiate a customer-set action according to the rules corresponding to each customer. For example, according to one embodiment, the rule application unit 120 directs the customer action generation unit 140 to generate a text message to notify a customer of the detected event in the power grid.

The additional data input unit 130 accesses and provides additional data to the rule application unit 120 and the customer action generation unit 140. The additional data is obtained from various sources including from the power provider, weather services, law enforcement, from the Internet, and from work crews, for example. According to various embodiments, the additional data includes time to complete a repair, weather conditions, and traffic conditions that affect the grid (such as accidents).

Although the embodiment illustrated in FIG. 2 includes a customer location unit 150 and customer action generation unit 140, according to alternative embodiments, the customer location unit 150 stores location information of any interested party, and not just customers. Interested parties include homeowners, business owners, employees, news organizations, navigation device organizations, and emergency services, for example. Similarly, according to alternative embodiments, the rule application unit 120 applies rules for all interested parties, not just customers, and the customer action generation unit 140 generates actions for interested parties, and not just customers.

Figure 3:
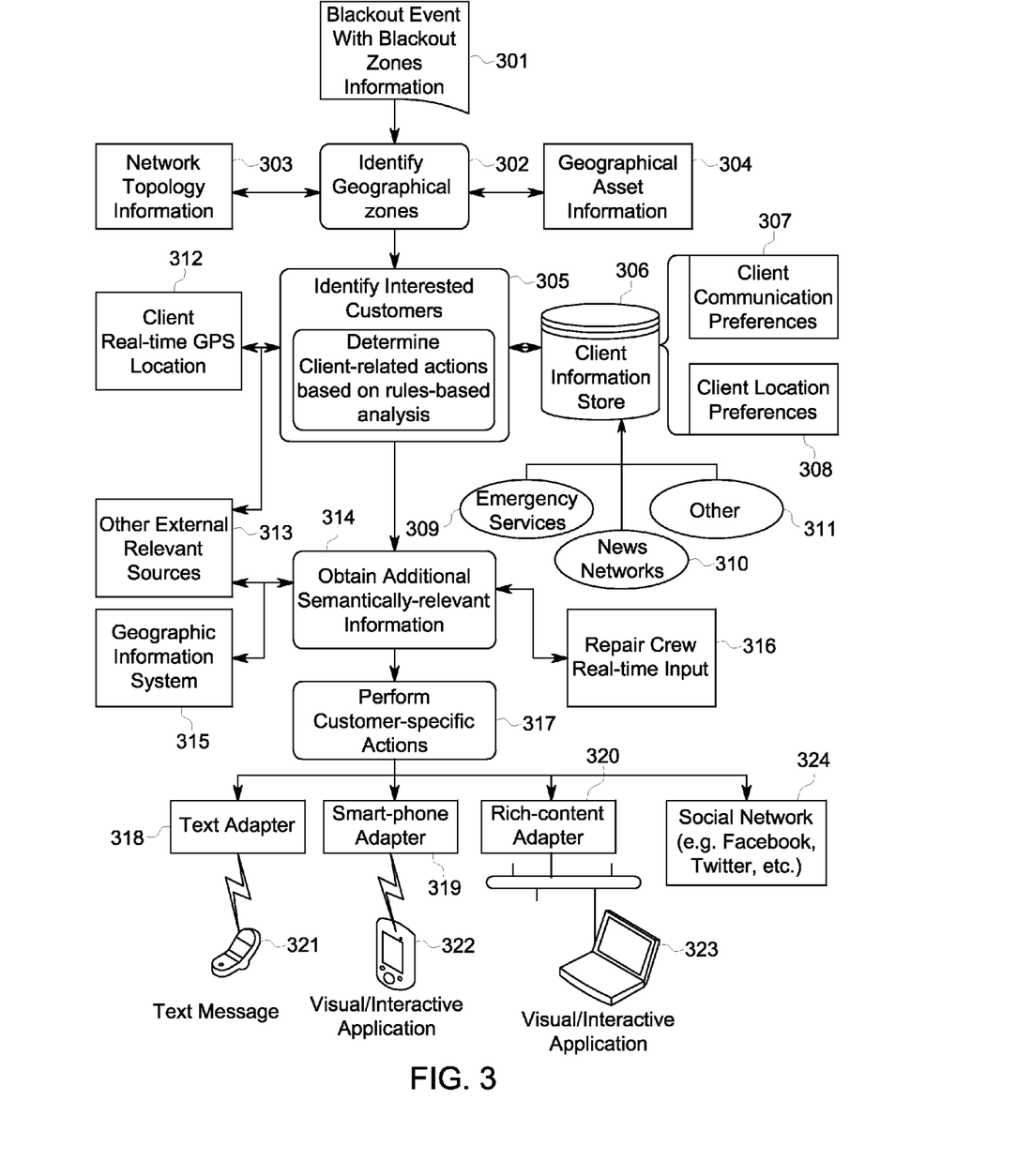
FIG. 3 is a diagram to illustrate operations of the power grid event detection apparatus.

FIG. 3 illustrates a functional diagram of a power grid event detection system to perform a pre-set action when a blackout event occurs on the grid. When a blackout occurs, the blackout zone information 301 is used to identify the geographical zones 302 in which the blackout has occurred. The system uses network topology information 303 and geographical asset information 304 to identify the geographical zones. Network topology information includes information regarding the interconnection of power lines, sub-stations, and customers, for example. The geographical asset information 304 relates to the geographic locations of the power lines, sub-stations, and customers of the grid network.

Once the affected geographical zones are identified, the interested customers within the geographical zones are identified 305. Client location information is determined from a client information store 306 including client location preferences 308, as well as from a client real-time GPS location 312. Client information including client communication preferences 307 and client location preferences 308 are provided by homeowners in the grid and businesses in the grid, as well as emergency services 309, news networks 310, and others 311.

If the client location information corresponds to the affected geographical zone information of the event, rules are applied to determine whether a client-related action is taken. The rules are located in the client information store 306. Other external sources 313 are also accessed to determine whether to perform a client-set action. For example, according to one embodiment, a client requests that an alert be sent regarding a geographical zone only at some hours of the day, such as during working hours. One external relevant source 313 is a clock or calendar. Other external relevant sources 313 include the Internet and an intranet of the power supplier.

Once it is determined that a client-related action is to be performed based on the client location preferences and blackout location data, additional semantically relevant information is obtained 314. The additional information includes geographic information, such as a map, from a geographic information system 315, real-time input from a repair crew 316, weather information, traffic information, or other information from the other external relevant sources 313.

A customer-specific action is performed 317 based on the results of the rules-based analysis and may include the additional semantically relevant information 314. According to the embodiment illustrated in FIG. 3, the customer-specific action includes transmitting an alert in text form to a mobile telephone 321 via a text adapter 318, to a smart-phone 322 via a smart-phone adapter 319, and to a laptop computer 323 via a rich-content adapter 320. The alert to the mobile telephone 321 is a text message. The alert to the smart-phone 322 includes a visual and interactive application, such as a map, Internet link, or other interactive application. Similarly, the alert to the laptop computer 323 includes the visual and interactive application.

In addition, the customer-specific action incudes transmitting an alert or other information to a social networking site 324. According to one embodiment, the social networking site 324 obtains location data from customers of the site and provides the customer-specific action to the customers of the site based on the obtained location data. According to another embodiment, a customer of the social networking site 324 provides the social networking site information in the client information store 306 as a desired destination of the customer-specific action.

According to one embodiment, the customer-specific action includes providing a customer-designated device with a link to a web-site. Web sites include a power provider web-site, a traffic or weather website, a news-web site, a social networking site, or any other desired site. Types of alerts include text messages, email messages, social networking site status updates, messaging site feeds, or any other type of electronically-transmitted message.

According to alternative embodiments, the customer-specific actions include commands to turn on or turn off devices, such as back-up generators or electronics equipment, or to control the operation of devices, such as by changing a traffic light from a red-yellow-green light to a flashing red light. In addition, while FIG. 3 illustrates mobile telephones and a laptop as being the customer-designated devices, according to alternative embodiments, alerts and commands are transmitted to personal computers, automobiles, navigation systems, computer networks, web-servers to provide content on websites, and other devices.

Figure 4:
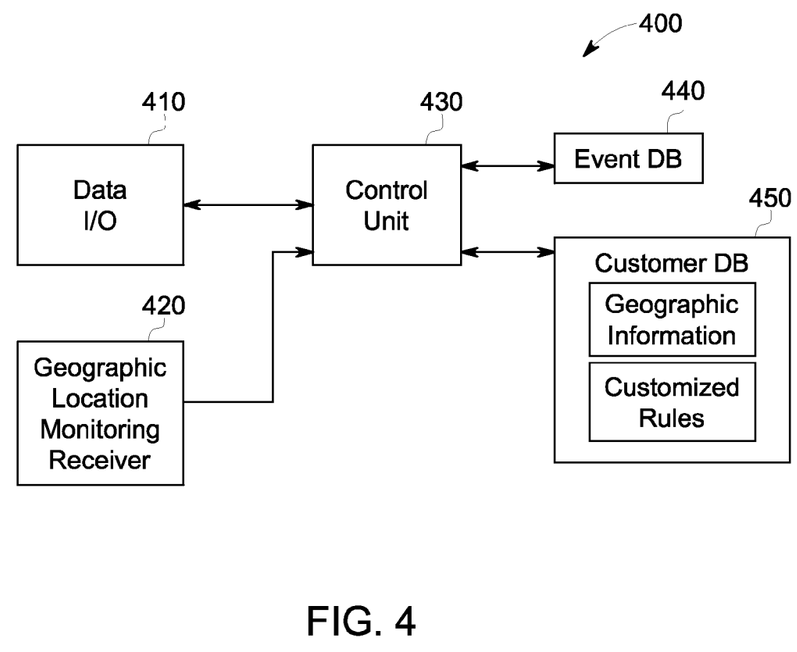
FIG. 4 is a diagram to illustrate a structure of the power event detection apparatus, according to one embodiment.

FIG. 4 illustrates the physical components of an event detection apparatus 400 according to one aspect of the invention. The event detection apparatus 400 corresponds to the event detection apparatus 100 of FIG. 2. However, since a same physical structure can participate in various functions represented by the blocks of FIG. 2, the event detection apparatus 400 is numbered distinctly from FIG. 2.

The event detection apparatus 400 includes a data input/output unit 410, a geographic location monitoring receiver 420, such as a GPS receiver, a Galileo receiver, or a Glonass receiver, a control unit 430, an event database 440, and a customer database 450. Event data and customer data are received via the data I/O unit 410, which includes wired I/O, such as Ethernet, telephone, and cable ports, as well as antenna to transmit and receive data wirelessly. When a power provider or customer inputs customer data including customer location data and customer-designated rules, the control unit 430 receives the data from the data I/O unit 410 and stores the data in the customer database 450.

The customer database 450 includes customer information including name, address and other geographic locations-of-interest, and customer-designated rules.

Figure 5:
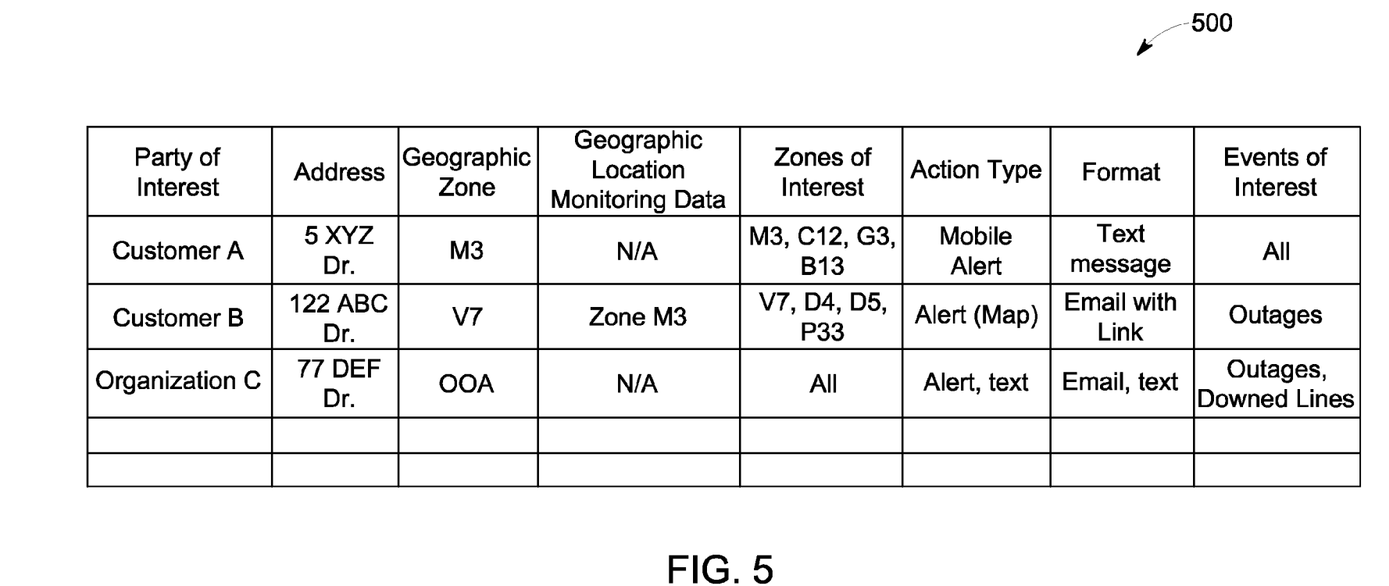
FIG. 5 is a diagram to illustrate data stored in an event database.

FIG. 5 illustrates an example of data 500 that is received by the data I/O unit 410 and stored in the customer database 450. Referring to FIG. 5, the address and geographic zone corresponding to the address of customers A and B, and organization C, is provided. Organization C is not a customer, or in other words, is not connected to the power grid, and thus the geographic zone of the customer is "OOA" or out of the area defined by the power grid. Examples of organizations that are not customers include emergency services, navigation and weather services, and news organizations. A customer or power provider indicates zones of interest to the customer, action types desired by the customer, formats corresponding to the action type, and the types of events that are of interest to the customer. In addition, if geographic location monitoring data is provided, the geographic location monitoring data is stored.

Figure 6:
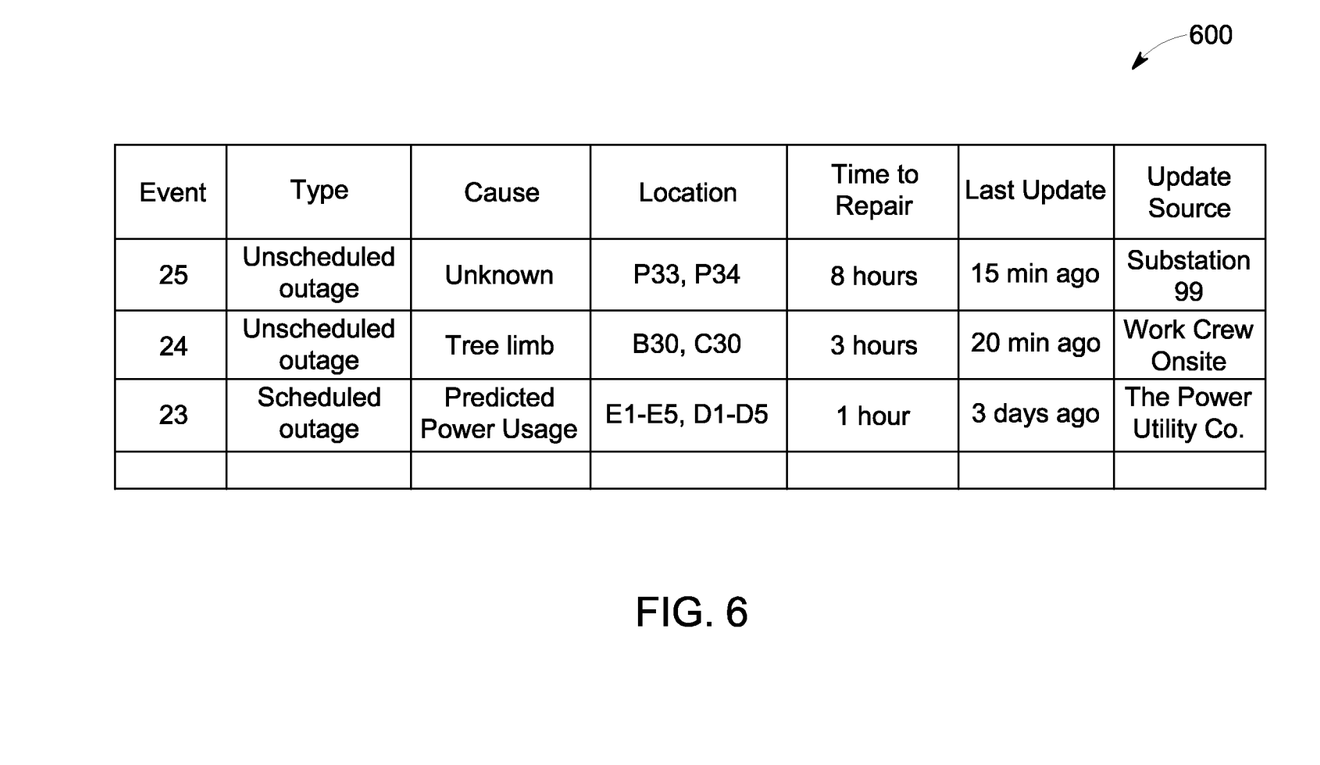
FIG. 6 is a diagram to illustrate data stored in a customer database.

Event data is received via the data I/O unit 410, and is stored in the event database 440. FIG. 6 illustrates examples of event data 600 stored in the event database 440. The event database 440 stores the classification type of the event, the cause, the location of the event, an estimated time to repair the grid, the last update, and the source of the last update.

The event data of the event database 440 is accessed by the control unit 430 and compared with the geographical data of the customer database 450 to determine whether to apply rules of each of the customers. For example, with reference to FIGS. 5 and 6, the unknown event 25 affects geographical zones P33 and P34 of the grid. Since zone P33 is of interest to customer B, and since outages are of interest to customer B, an alert, including a map, is sent to a destination designated by customer B.

The geographic location monitoring receiver 420 receives data from geographic location monitoring devices and transmits the data to the customer database 450. For example, with reference to FIG. 5, customer B has a geographic location monitoring function enabled. The geographic location monitoring receiver 420 receives geographic location monitoring data from a device set up by customer B, determines zones of the grid that correspond to the geographic location monitoring coordinates, and stores the determined zones in the customer database 450. When the zones in which a power outage or other event occurs correspond to the zone indicated by the geographic location monitoring signal, the control unit 430 applies a rule set up by customer B to determine whether to send an alert or command to a device corresponding to customer B.

The control unit 430 includes at least a processor, a memory, and supporting logic circuitry to perform comparisons, to convert data into formats for storing and transmitting, to control storage operations and transmitting operations, and to perform any other operations of the event detection apparatus 400.

Figure 7:
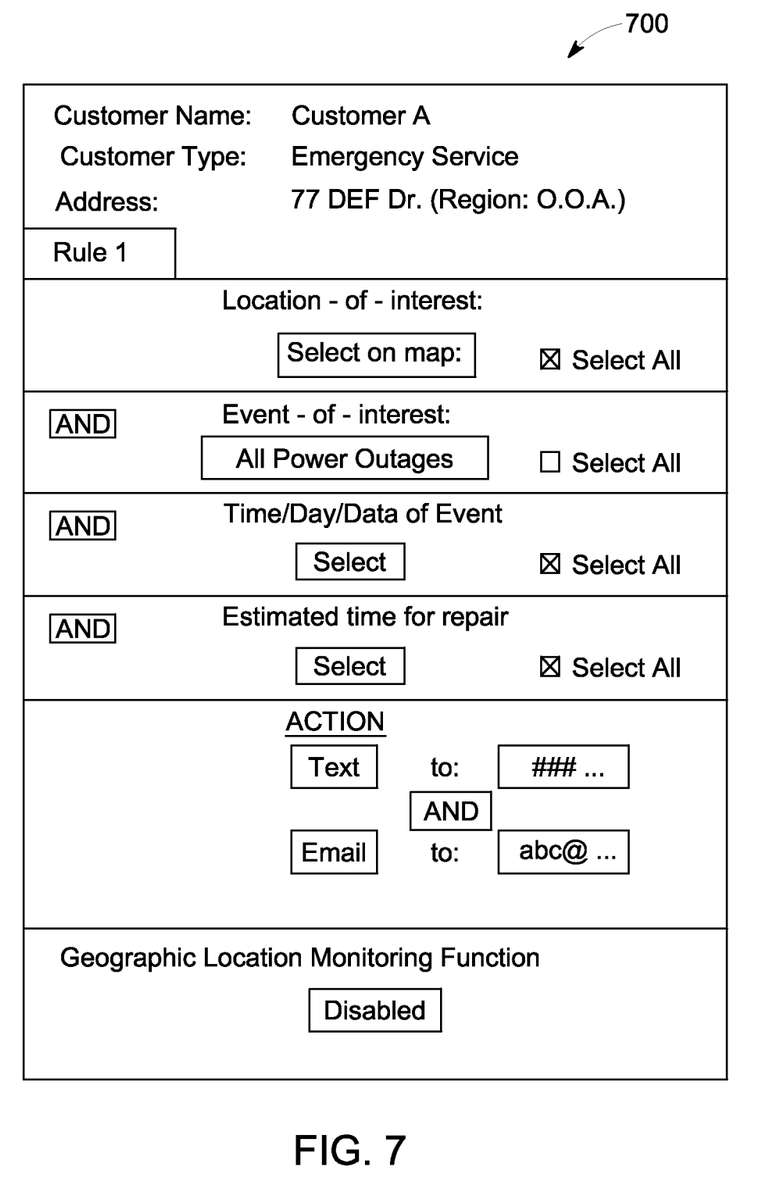
FIG. 7 is a diagram to illustrate customer-designated rule generation options.

FIG. 7 illustrates a customer-designated-rule entry screen 700. The screen 700 is displayed on a personal computer or other electronic device, and the customer or power provider enters data to generate user-based rules. Each customer generates one or more rules, such as one rule for scheduled power outages and a separate rule for unscheduled power outages. According to alternative embodiments, customers generate different rules for different times of the day, different days of the week, and different types of events. For example, according to one embodiment, a customer sets a rule to be notified of power outages in regions that correspond to a commute to and from work on weekdays only to allow the customer to find alternative commute routes. According to another embodiment, the customer sets a rule to notify a third party if the power is expected to be out for longer than a set period of time and if the customer's geographic location monitoring coordinates indicate that the customer is away from home. Thus, a customer's home may be secured by a neighbor, for example, even if the customer is away from home.

The screen 700 includes fields for entering a customer name, type, address, regions-of-interest, alert types, destination addresses, events-of-interest, and geographic location monitoring tracking settings. According to various embodiments, the customer selects regions-of-interest by selecting regions on a displayed map, selecting regions from a drop-down menu, or entering addresses or intersections, which are then automatically associated with regions in the power grid.

The user selects a type of action to be performed, including sending a notice to a mobile device, personal computer, server, or email, and transmitting a command to a customer-designated device. In addition, the user provides a destination address or other destination information corresponding to the action. For example, when the event is an alert, the user provides a mobile phone number or email address to which the alert is transmitted.

The customer selects events-of-interest for which the customer is interested in having actions performed. For example, according to one embodiment, a customer sets up only an alert to be sent for scheduled events, such as power line maintenance and scheduled blackouts. In addition, the user sets up both alerts and commands to be transmitted to remote devices for unscheduled blackouts.

Figure 8:
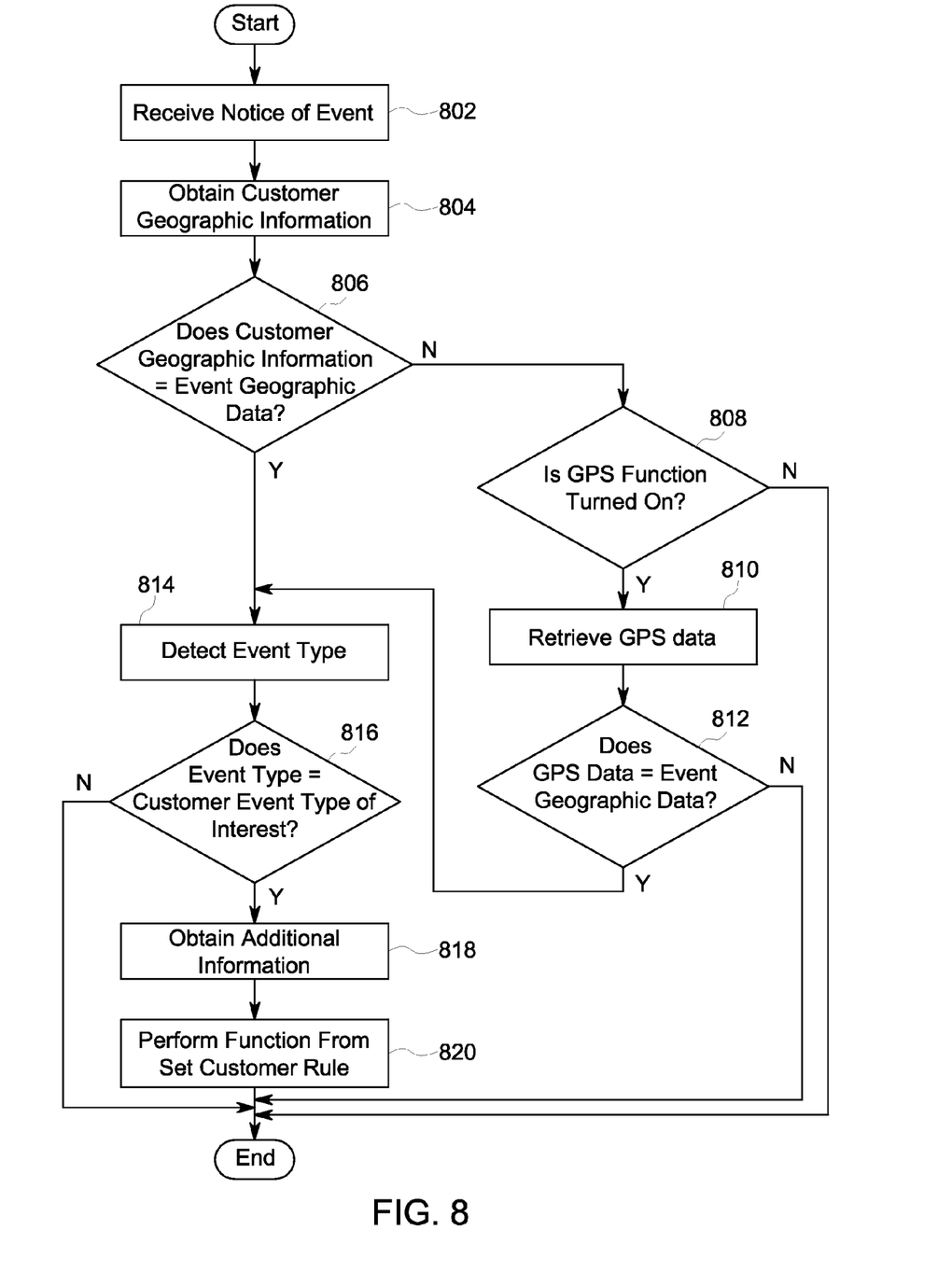
FIG. 8 is a flow diagram to illustrate an operation of detecting a power grid event and performing a customer-set option, according to one embodiment.

FIG. 8 illustrates a method of detecting a power-related event and performing a customer-designated action. In operation 802, an event is detected. The detected event is either a scheduled event, such as a scheduled blackout, or an unscheduled event, such as a weather-related power outage. Receiving a notice of the event 802 includes receiving location data corresponding to the event. The location data includes areas within the power grid affected by the event.

In operation 804, customer geographic information is retrieved. Customer geographic information includes an address of all of the customers and locations that the customers have designated as locations-of-interest. In operation 806, it is determined for each customer whether the customer geographic information corresponds to the event geographic information. If the customer geographic information corresponds to the event geographic information, the process proceeds to operation 814 for each customer. If the customer geographic information does not correspond to the event geographic information, it is determined in operation 808 whether a geographic location monitoring detection function, such as a GPS, Galileo, or Glonass function, is turned on for each customer. If not, the process ends.

If the geographic location monitoring detection function is turned on, the geographic location monitoring data is retrieved in operation 810. In operation 812, it is determined whether the geographic location monitoring geographic data corresponds to the event geographic data. If not, the process ends. If the geographic location monitoring geographic data corresponds to the event geographic data, the process proceeds to operation 814. If not, the process ends.

Once it has been determined that the geographic information of a customer corresponds to the geographic location of the event, the rules corresponding to each customer associated with the geographic location of the event are executed. In operation 814, the event type is determined. The event type includes general types, such as scheduled events and unscheduled events, as well as specific types, such as blackouts, work to update, repair or expand the grid, and tree trimming. In operation 816, it is determined whether the detected event type corresponds to an event type that is of interest to the customer. If not, the process ends. However, if the detected event type corresponds to an event type that is of interest to the customer, additional information is obtained in operation 818. The additional information includes weather information, traffic information, and work crew information, for example.

In operation 820, a function designated by a user is executed. The function includes an alert or command to a remote device.

As a result of the above systems, apparatuses, and methods, an action designated by a customer is performed in response to events at locations corresponding to the customer, and events that are designated by the customer as being of-interest to the customer. A power provider or other entity determines from among all of the customers, clients, or interested parties registered in a system which parties are associated with a location of an event in the grid. Then, the power provider or other entity performs an action designated by the customer, client, or interested party.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

The invention claimed is:

1. A power grid event detection apparatus, comprising:
    an event detection unit to detect at least a location of an event in a power grid;
    a customer location unit to receive an input from an interested party identifying a location of interest to the interested party, to associate the location of interest with a location in the power grid, and to determine, based on detecting the location of the event in the power grid, whether the location of the event corresponds to the location of interest to the interested party; and
    a rule application unit to determine whether to perform an action designated by the interested party at least when the location of the event corresponds to the location of interest to the interested party.

2. The power grid event detection apparatus of claim 1, wherein the event detection unit further detects a type of the event.

3. The power grid event detection apparatus of claim 2, wherein the rule application unit compares the detected type of event to a designated type of event having been designated by the interested party as a type of event of interest to the interested party, and performs the action when the detected type of event corresponds to the designated type of event.

4. The power grid event detection apparatus of claim 1, wherein the event detection unit includes an event database to store event location information of the event in the power grid and to store at least one of an event type, an event cause, and an estimated repair time corresponding to the event.

5. The power grid event detection apparatus of claim 1, wherein the customer location unit includes at least a customer database to store the location of interest to the interested party.

6. The power grid event detection apparatus of claim 5, wherein the location of interest corresponds to at least one of an address of the interested party and a location designated by the interested party.

7. The power grid event detection apparatus of claim 5, wherein the customer database stores an action type designated by the interested party and an event type designated by the interested party,
    wherein the rule application unit detects a type of the event in the power grid, and compares the detected type of the event to the event type designated by the interested party, and performs the action designated by the interested party when the detected type of the event corresponds to the event type designated by the interested party.

8. The power grid event detection apparatus of claim 1, wherein the customer location unit includes a geographic location monitoring receiver, and the location of interest includes a location indicated by the geographic location monitoring receiver.

9. The power grid event detection apparatus of claim 1, further comprising a customer action generation unit to generate signals corresponding to the action designated by the interested party, and to transmit the signals to a destination designated by the interested party.

10. The power grid event detection apparatus of claim 9, wherein the customer action generation unit includes at least one of a text adapter, a smart phone adapter, and a rich-content adapter to transmit data to a text-receiving mobile phone, a smart phone, a personal computer, and a social networking website, respectively.

11. The power grid event detection apparatus of claim 9, further comprising an additional data input unit to receive additional data including at least one of repair crew data, weather data, and traffic data, and to transmit the additional data to at least one of the rule application unit and the customer action generation unit.

12. The power grid event detection apparatus of claim 9, wherein the customer action generation unit generates a message including information regarding the location of the event in the power grid and transmits the message to a remote device designated by the interested party.

13. The power grid event detection apparatus of claim 9, wherein the customer action generation unit generates a hyperlink to a website that includes information regarding the location of the event in the power grid and transmits the hyperlink to a remote device designated by the interested party.

14. A power event detection system, comprising:
    a power grid to supply power to customers;
    an event detection apparatus to detect at least a location of an event in the power grid, to compare the location of the event to a location of interest to an interested party, the location designated by the interested party as being of interest to the interested party, and to perform an action designated by the interested party when the location of the event corresponds to the location of interest to the interested party; and a remote device of the interested party to receive from the event detection apparatus at least one of an alert and a command corresponding to the action designated by the interested party.

15. The power event detection system of claim 14, wherein the event detection apparatus further compares a type of the event in the power grid with a type of event designated by the interested party and performs the action designated by the interested party when the type of the event in the power grid corresponds to the type of event designated by the interested party.

16. The power event detection system of claim 14, wherein the action designated by the interested party is an alert, and the remote device is an electronic communications device designated by the interested party.

17. A method of responding to an event in a power grid, the method comprising:

obtaining location information of the event in the power grid;

obtaining location-of-interest information designated by an interested party as being of interest to the interested party;

comparing the location information of the event with the location-of-interest information; and performing an action designated by the interested party when at least the location information of the event corresponds to the location-of-interest information.

18. The method of claim 17, wherein obtaining the location-of-interest information designated by the interested party includes at least one of determining a location corresponding to an address of the interested party, determining a location corresponding to a geographic location designated by the interested party, and determining a location corresponding to geographic location monitoring data transmitted by a device designated by the interested party.

19. The method of claim 17, further comprising:

detecting event type information of the event in the power grid;

obtaining event-of-interest information designated by the interested party;

comparing the event-of-interest information with the detected event type information; and performing the action designated by the interested party when the detected event type information corresponds to the event-of-interest information.

20. The method of claim 17, wherein performing the action designated by the interested party includes generating an alert and transmitting the alert to a remote device designated by the interested party.

* * * * *